United States Patent [19]

Reis

[11] Patent Number: 5,493,721
[45] Date of Patent: Feb. 20, 1996

[54] RECEIVER FOR A DIGITAL RADIO SIGNAL

[75] Inventor: Johannes Reis, Herzogenaurach, Germany

[73] Assignee: Grundig E.M.V., Furth/Bay, Germany

[21] Appl. No.: 148,313

[22] Filed: Nov. 8, 1993

[30] Foreign Application Priority Data

Nov. 7, 1992 [DE] Germany .......................... 42 37 692.0

[51] Int. Cl.$^6$ ............................... H04B 1/16; H04B 1/10; H03D 3/18
[52] U.S. Cl. ............................ 455/339; 455/266; 375/316
[58] Field of Search ................................. 375/15, 103, 94, 375/82, 77; 455/339, 266, 313; 307/512, 521, 522, 523, 524; 333/18, 28 R, 166

[56] References Cited

U.S. PATENT DOCUMENTS

| | | | |
|---|---|---|---|
| 4,728,957 | 3/1988 | Hethuin | 342/401 |
| 4,736,392 | 4/1988 | Kammeyer et al. | 375/80 |
| 4,794,341 | 12/1988 | Barton et al. | 329/50 |
| 4,953,184 | 8/1990 | Simone | 375/103 |

OTHER PUBLICATIONS

IEEE-publication vol. AES-20, No. 6, Nov. 1984, pp. 821-824, entitled "A Simple Method of Sampling In-phase and Quadrature Components".

*Primary Examiner*—Edward F. Urban
*Assistant Examiner*—Lee Nguyen
*Attorney, Agent, or Firm*—Kane, Dalsimer, Sullivan, Kurucz, Levy, Eisele & Richard

[57] ABSTRACT

The apparatus includes a mobile receiver for digital audio broadcasting. The transmission process is substantially entirely digital and a whole frequency range is used for the terrestrial transmission. The apparatus includes a receiver for a digital radio signal, particularly wherein the filter coefficient is changeable by a control circuit which generates a first value for the filter coefficient to get the real signal component and thereafter generates a second value for the imaginary signal component, whereby with the switching over of the first and second values for the filter coefficient a simultaneous downsampling of the digital signal is performed.

2 Claims, 4 Drawing Sheets

RECEIVER FOR A DIGITAL RADIO SIGNAL

BACKGROUND OF THE INVENTION

1. Field of the Invention

The invention relates to a receiver for a digital radio signal, particularly wherein the filter coefficient is changeable by a control circuit which generates a first value for the filter coefficient (APK) to calculate the real signal component and thereafter generates a second value for the imaginary signal component, whereby with the switching over of the first and second values for the filter coefficient (APK) a simultaneous downsampling of the digital signal is performed.

2. Description of the Prior Art

Presently, receivers for radio transmissions generally operate using analog VHF transmission. However, in order to improve the transmission quality, digital processes are frequently used, such as digital satellite radio (DSR). Thereby, a transmission signal is transmitted from the transmitter via satellite to the receiver. In order not to equip every single receiver with an antenna and a first low-noise mixer for the satellite radio, which are relatively large and expensive, a DSR-signal may be fed from a central terrestrial receiver also over broadband cable networks to the receiver.

However, for the mobile receiving in motor vehicles or portable devices, this is not practical. In order to provide transmission for mobile reception which corresponds to the quality standard offered by the digital technology (e.g., digital compact cassette, compact disc), digital audio broadcasting (DAB) was developed wherein individual carrier frequencies are simultaneously emitted with an equidistant frequency distance in a frequency range having the bandwidth B. Thus, signal distortions which result from frequency selective field strength fluctuations and multipath reception are prevented. The individual carriers are each modulated with a part of the digital data, whereby the modulation contents of the individual carriers are identical for all transmission stations. When the operation is time multiplexed, data of different programs can be transmitted in a timely sequence within the data package, so that for change in program in the receiver, no change of the tuning frequencies is required, rather the sequentially associated decoding of the data packages is changed.

A digital receiver is used to achieve the best possible reception quality of a digital transmission signal. Such a digital receiver is known from DE-34 28 318 A1. In this receiver, the analog reception signal is mixed down into an intermediate frequency signal by a mixer, will be band-limited with an analog bandpass filter, sampled, analog-to-digital converted and multiplied with complex signal of an oscillator in at least one digital signal processor. In this manner, the quadrature components of the reception signal are generated in the baseband.

The disadvantage in this receiver is the extensive processing of the analog-to-digital converted signal. At least one digital signal processor is required for performing a multiplication with a complex oscillator signal.

A digital demodulator for frequency modulated signals is disclosed in EP-0 201 758 B1, which enables compensation of multipath reception. In this demodulator, the reception signal is also first mixed down into an intermediate frequency signal, band-limited and analog-to-digital converted. Thereafter, the digital signal is fed to a cascading equalizer which performs a reduction of the reflections contained in the input signal.

This demodulator is disadvantageous in that it requires a complex circuit and corresponding engineering effort, particularly in view of the cascading equalizers.

A circuit is disclosed in the IEEE-publication Vol. AES-20, No. 6, November 1984, pages 821–824, entitled "A Simple Method of Sampling In-phase and Quadrature Components", which mixes down the reception signal, band limits the same, samples and performs analog-to-digital conversion. The digital signal is downsampled and fed to two parallel switched all-pass filters, of which the one emits the real signal component and the other the imaginary signal component of the input signal.

This circuit is disadvantageous due to its very high sampling rate, which requires a high processing speed in the analog-to-digital converter. Furthermore, the two fifth order all-pass filters require a complex switch.

OBJECTS AND SUMMARY OF THE INVENTION

It is therefore an object of the invention to provide receiver which is of simple design including digital circuit which can be constructed as integrated circuits. Further, the receiver should be low cost and compact.

This object of the invention is solved by the receiver as disclosed and claimed herein.

The receiver circuit in accordance with the invention is advantageous in that the value of the filter coefficient of the employed all-pass filter can be changed, whereby only a single all-pass filter generates the real signal component as well as the imaginary signal component with a reduced circuit complexity. Thereby, scattering of the components, which result in phase errors, can be eliminated. Furthermore, the all-pass filter is advantageous in that during the switching over of the value of the filter coefficient a downsampling of the signal is made possible, without requiring an additional circuit effort.

An aspect of the disclosed receiver is advantageous in that only a single demodulator circuit is required for the real and the imaginary signal component, since the signal components are emitted serially by the all-pass filter. Furthermore, it is advantageous that this demodulator circuit is digitally implemented, so that this circuit is particularly economical and can be implemented as an integrated circuit.

A further aspect of the disclosed receiver is advantageous in that the value of the coefficient of the all-pass filter is switched by the sampling rate employed in the A/D converter. Thus, from a first sampling value of the input signal, the real signal component is generated, and from the following sampling value of the input signal the imaginary signal component. Because only every second sample value is used to extract the real or imaginary signal component, it simultaneously represents a downsampling with the factor two. Therefore, for this downsampling, no specific process steps or circuits are required. It is further advantageous to provide a timely sequential emission of the real and imaginary signal components.

A still further aspect of the receiver disclosed is advantageous in that the multiplication of the digital signal can be traced back to a summation with the filter coefficient, whereby the circuit complexity and processing can be substantially reduced.

A still further aspect of the receiver disclosed is advantageous in that for mixing down the two signal components into the baseband the complement of the sampling values must only be formed at each second real and each second imaginary signal component. This corresponds to a multiplication of the two signal components with the sequence of sampling values of a cosine-function, which results in a demodulation of the two signal components.

A still further aspect of the receiver disclosed is advantageous in that a bandpass of a lower order may be used for band limitation at an intermediate frequency of 3072 kHz. Furthermore, by the selection of the intermediate frequency a sampling rate of the A/D converter of 4096 kHz may be selected, so that the input signal is analog-to-digital converted in the intermediate frequency range and period effects of the sampling may be used.

A still further aspect of the receiver disclosed is advantageous in that a filter of lower order only is required as the all-pass filter.

BRIEF DESCRIPTION OF THE DRAWINGS

Further objects and advantages of the invention will become apparent from the following description and claims, and from the accompanying drawings, wherein:

DETAILED DESCRIPTION OF THE PREFERRED EMBODIMENT

Figure 1:
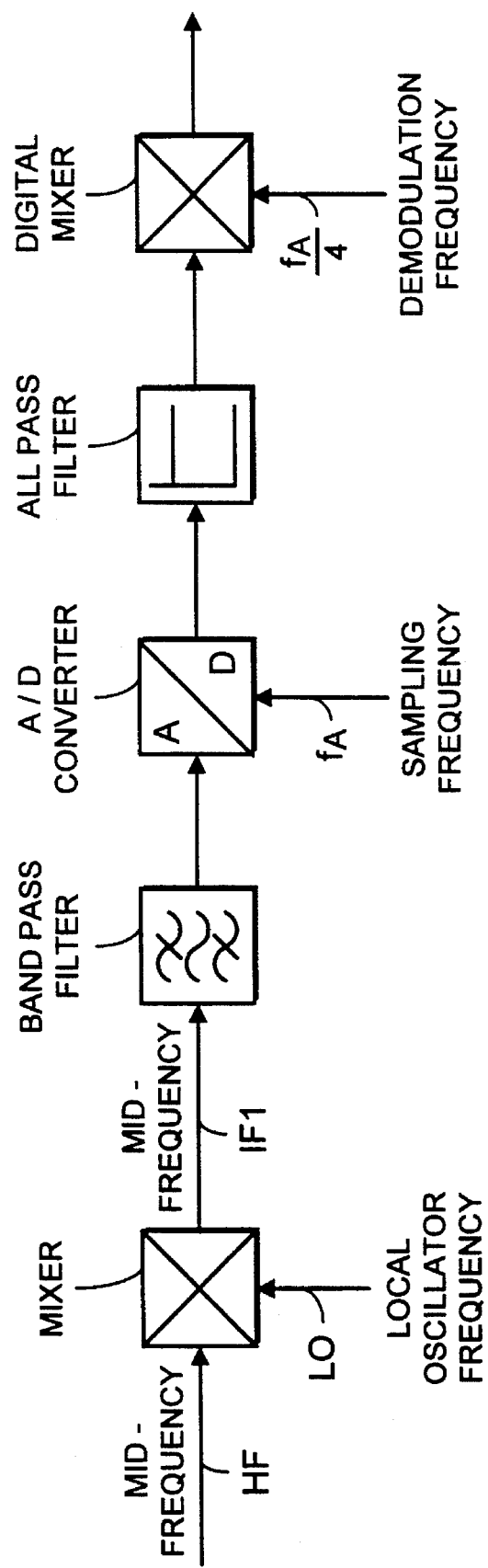
FIG. 1 is a block diagram of the receiver of the invention.

The receiver of the present invention is illustrated as a block diagram in FIG. 1. The receiver includes the mixer M, the bandpass filter BP, the A/D converter A/D, the all-pass filter AP and the digital mixer DM. At first, the receiving signal with the mid-frequency HF is mixed down in a mixer M with a signal of the frequency LO into an intermediate frequency position at the mid-frequency IF1. Thereby, the frequency LO is selected in such a manner that the mid-frequency IF1 in the intermediate frequency position is always 3072 kHz. If the transmission frequency or the frequency range employed for the transmission is changed, then the frequency LO changes, while the frequency IF1 remains constant. The signal in the intermediate frequency position IF1 is subsequently band limited by a bandpass filter BP. It limits the IF-signal to the frequency range employed for the information transmission between about 2200 kHz and 3800 kHz. At first, this signal is sampled in the A/D converter with the sampling frequency $f_A$=4096 kHz and is subsequently converted into digital sample rates. Subsequently, the downsampling, the all-pass filtering and the digital demodulation of the digital signal is performed.

Figure 2A:
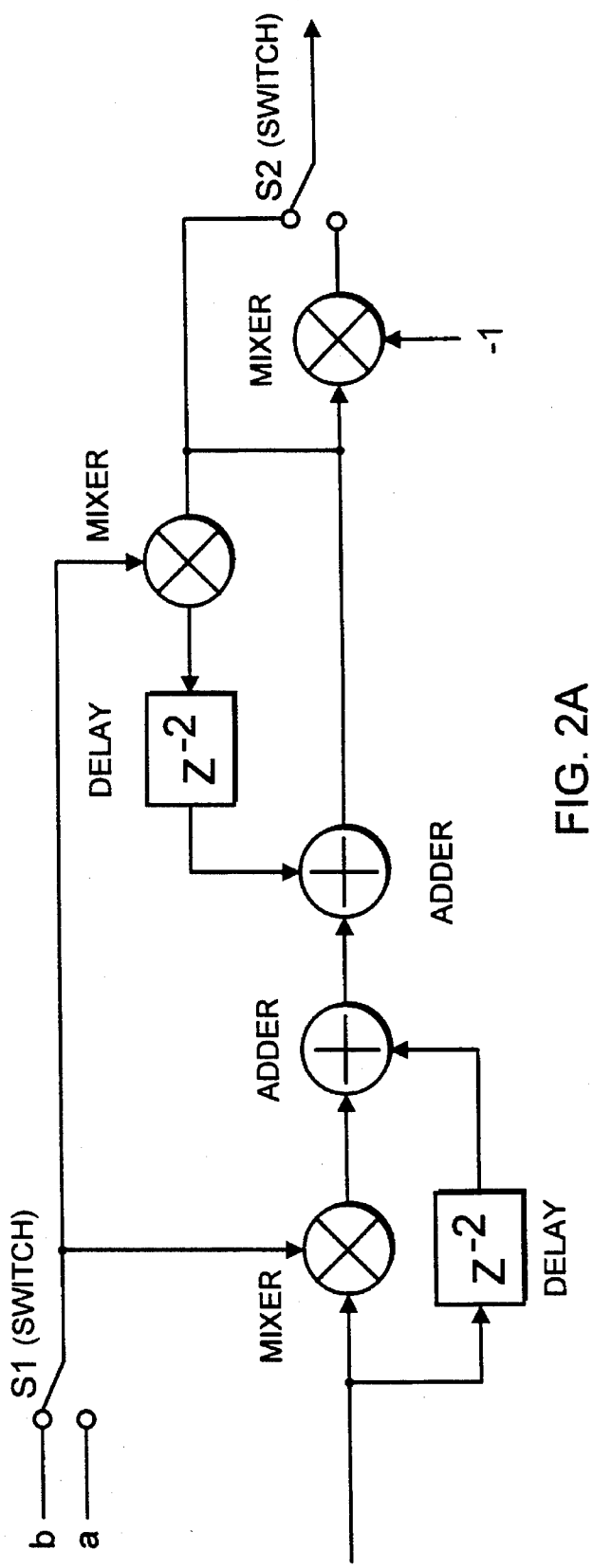
FIG. 2a is a block diagram of the all-pass filter and the digital demodulator.

The circuits which perform these process steps are illustrated in detail in FIG. 2a. At first, the output signal of the A/D converter A/D is fed to the all-pass filter AP. With this all-pass filter AP, the switch S1 for the filter coefficient APK is switched with half of the sampling rate $f_A/2$ of the A/D converter A/D. By selecting this switching frequency, the real signal component or the imaginary one is generated for one sampling value of the input signal. This corresponds to a downsampling with the factor 2, since the real and imaginary signal components are not generated for each sampling value of the input signal. The control of switch S1 is performed by an already present control unit of the receiver.

A first value "a" for the filter coefficient APK is selected in such a manner that the output signal of the all-pass filter AP is the real signal component of the input signal, a second value "b" for the filter coefficient APK is selected in such a manner that the imaginary signal component of the input signal is emitted.

Corresponding to the two transmission functions:

$$H_a(z) = z^{-1} * (z^{-2}+a)/(1+a\,z^{-2})$$

$$H_b(z) = -(z^{-2}+b)/(1+b\,z^{-2})$$

for the alternating generation of the real and imaginary signal components of the input signal, an all-pass filter with a switchable transmission function is provided. By downsampling the output signal of the A/D converter A/D with the factor two, the first factor $z^{-1}$ of the transmission function $H_a(z)$ is realized. Thereby, the factor $z^{-1}$ merely causes a delay by one sample value or one cycle period of the sampling frequency $f_A$. This means that the all-pass filter AP at first realizes the transmission function $H_b(z)$. Thereafter, the output signal of the A/D converter A/D is multiplied with the filter coefficient APK and additively superimposed by the output signal of the A/D converter A/D which is delayed by two cycle periods of the sampling frequency $f_A$. With the signal generated in this manner, the filter coefficient APK is multiplied and the output signal of the adder is delayed by two cycle periods of the sampling frequency $f_A$ and is added to the result of the multiplication. From the two transmission functions $H_a(z)$ and $H_b(z)$, it can be seen that when using the value "a" as the filter coefficient APK, the transmission function $H_a(z)$ is realized for every second value because of the downsampling. Should the transmission function $H_b(z)$ be realized, one would switch over by means of a switch S1 to the value "b" for the filter coefficient APK and additionally the output signal of the all-pass filter AP is switched over by a switch S2 and multiplied with −1.

Therefore, the switches S1 and S2 must be switched with the sampling rate and realize the transmission function $H_b(z)$ in their initial position.

Figure 2B:
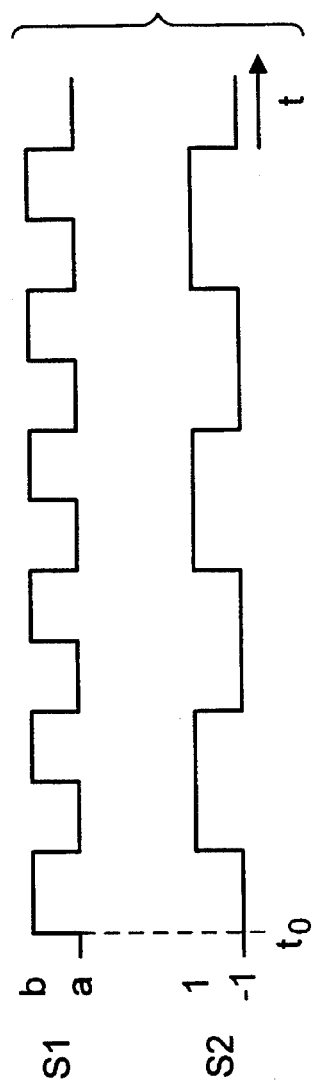
FIG. 2b discloses the control signals for the two switches of the all-pass filter.

Subsequently, the mixing down to the baseband is performed in the digital mixer DM. For this purpose, the output signal of the all-pass filter AP is multiplied with a series of sampling values of a cosine function of the frequency $f_A/4$, these are the values 1 and −1. Now the two multiplications for realizing the transmission function and for mixing down to the baseband can be combined, so that only a single multiplication is required. Since in both multiplications only the factors 1 and −1 appear, again a multiplication with 1 or −1 is the result thereof. The exact process of the control signals for the switches S1 and S2 is illustrated in FIG. 2b, as a function of time.

Figure 3:
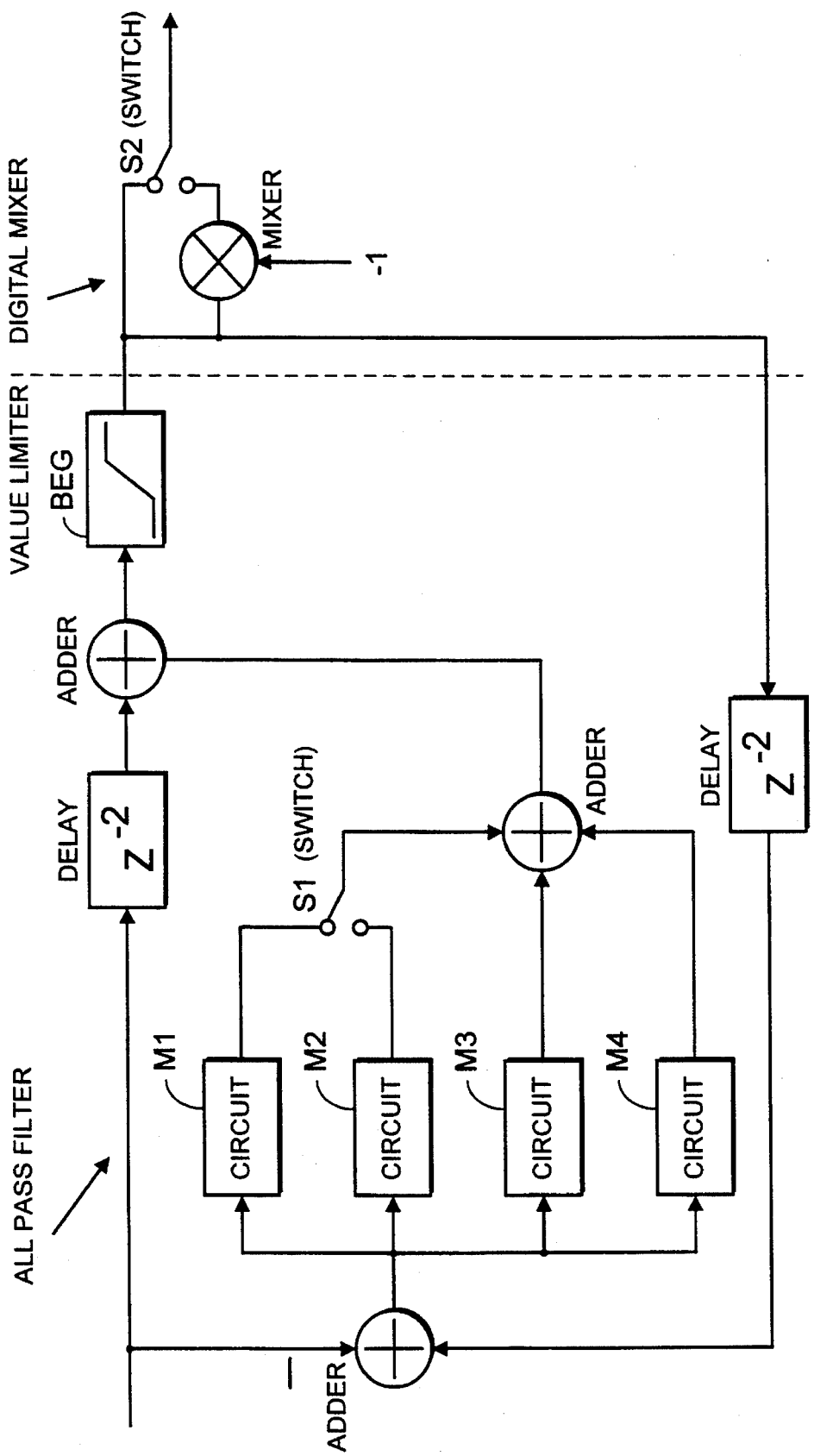
FIG. 3 is a block diagram of the receiver suitable for the integration, and FIG. 4(a–e) discloses the spectrum of various signals present in the receiver.

FIG. 3 illustrates a circuit construction of the all-pass filter AP and the digital mixer DM from FIG. 2a, which is particularly suitable for construction as an integrated circuit. At first, the negative output data of the A/D converter A/D are additively superimposed with the output data of the all-pass filter AP, which were delayed by two cycle periods of half of the sampling frequency $f_A/2$ of the A/D converter A/D. The values generated in this manner are subsequently multiplied with the filter coefficient APK. For this purpose the two values "a" and "b" for the filter coefficient APK are approximately calculated by a sum of two powers. For the value "a" which generates the real signal component of the input signal, approximately $a \approx 2^{-1}+2^{-3}+2^{-4}= 0.6875$ is employed For the value "b" which generates the imaginary signal component of the input signal, approximately $b \approx 2^{-3}+2^{-4}+2^{-5}=0.21875$ is employed. In order to realize the multiplication of "a" with a signal value, the valuation rating of the individual data lines through which the signal values are transmitted, are changed in accordance with the exponents of the two powers, and the signal values which were transmitted by data lines of equal rating are summed up. For example, for the multiplication of the factor $2^{-1}$ with an 8-bit wide data bus, the data line for which the rating 2 is associated, the new rating $2^{-1}$ is associated, the data line with the rating $2^1$ the new rating $2^0$ is associated etc., up to the data line with the rating $2^7$, (with the new rating $2^6$). Therefore, a displacement shift occurs by one bit to the lower ratings of the data lines, which corresponds to a multiplication with $2^{-1}$.

Subsequently, the signal values are summed up in the data lines with the same ratings, whereby naturally a carry over is taken into consideration. If the width of the data bus should be maintained at eight bits, all data lines, whose rating is smaller than $2^0$, are no longer summed up, whereby the transmitted signal value is neglected. This requires to select somewhat larger values for the two powers, than seems to be justified by the exact values for "a" and "b". In order to increase the exactness with which calculation is performed in the all-pass filter AP, there is a possibility to design the data bus wider within the all-pass filter AP. Thus, the calculations may be performed with a nine or ten bit accuracy.

The result is that the sum of the signal values of the data lines with the old ratings $2^4$, $2^3$ and $2^1$ receive the new rating $2^0$ and are added up. The result of the summation is fed further on the data line with the rating $2^0$. The sum of the signal values of the data lines with the old ratings $2^5$, $2^4$ and $2^2$ obtain the new rating $2^1$ and are added up by taking into consideration an eventual carry over. In order to calculate the signal value on the data line with the new rating $2^4$, only the signal values of the data lines with the old ratings $2^7$ and $2^5$ have to be added plus a carry over. Thus, a multiplication can be brought back to a simple addition. The addition of the values is performed by connecting the data lines of the required old values with the inputs of the multiplier and the output value of which is applied to the data line with the new value.

Since the sums for the values "a" and "b" of the filter coefficient APK differ only by $2^{-1}$ and $2^{-5}$, the switching over between the values "a" and "b" is already achieved by switching over only these two summations. As illustrated in FIG. 3, with the sum of the delayed output signal and input signal the value of the individual data lines in the circuits M2 and M4 for the sums $2^{-3}$ and $2^{-4}$, in the circuit M1 for the sum $2^{-1}$ and in the circuit M2 for the sum $2^{-5}$ are newly determined. Subsequently, the signal values are added. The switching over between values "a" and "b" and thereby between real and imaginary signal components is performed by a switching over between the different sums for the two values. The switching over is performed with half of the sampling frequency $f_A/2$, as already described in FIG. 2. Subsequently, the output signal of the A/D converter A/D which had been delayed by a cycle of half of the sampling frequency $f_A/2$ is added. The data calculated in this manner is available for a digital downmixing in the baseband, after a limitation BEG of the value range to ±127 with an 8-bit data bus.

The downmixing will be achieved by a multiplication of the output data of the all-pass filter AP with 1 or −1, the sampling rates of a cosine function, as explained with respect to FIG. 2. The multiplication with −1 is performed by a complement forming of the data of the all-pass filter AP. Hence, this multiplication can also be simplified.

FIG. 4 a–e illustrates the signal spectrums generated in the receiver. Thereby, only the signal portions are illustrated which are of importance to the receiver. FIG. 4a illustrates the input signal of the receiver during DAB-radio, which has an enormous bandwidth, at the mid-frequency HF, as well as the signal of the local oscillator at the frequency LO. With the aid of this signal, the input signal is mixed down into the intermediate frequency range at the mid-frequency IF1= 3072 kHz. This mid-frequency IF1 is always constant, a change of the mid-frequency HF of the receiving signal is again equalized by a change of the local oscillator frequency LO. The dash line symbolizes the filter characteristics of the subsequent bandpass filtering.

Figure 4A:
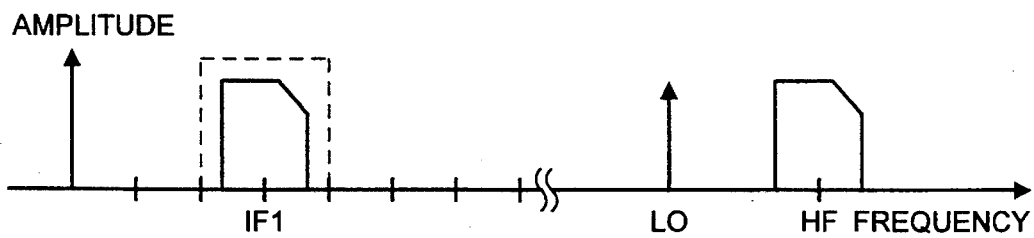

The flank steepness of the bandpass filter BP may be substantially less than illustrated in FIG. 4a.

Figure 4B:
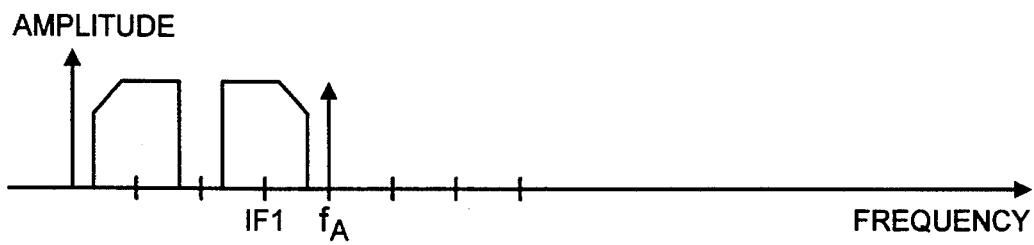

FIG. 4b illustrates the spectrum after the bandpass filtering as well as the frequency $f_A$ of the sampling in the A/D converter A/D. The sampling with the sampling frequency $f_A=4096$ kHz results in a periodizing of the spectrum, so that at a median frequency of 1024 kHz the signal spectrum appears in a reverse position.

Figure 4C:
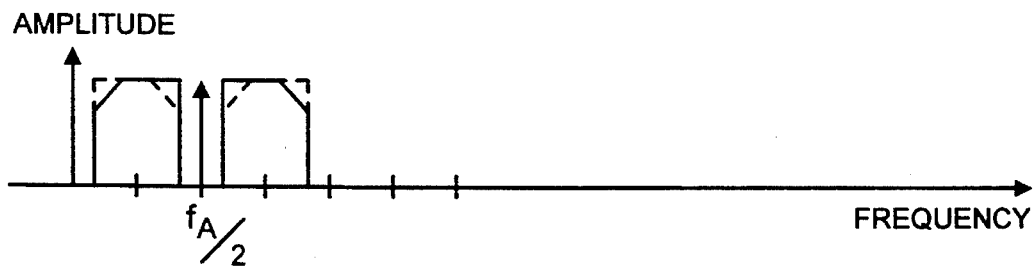

FIG. 4c illustrates the output signal of the all-pass filter AP. By splitting the receiving signal into a real (solid line) and an imaginary (dashed line) signal component, the corresponding spectrums are created which are also periodized by the additional downsampling with the sampling frequency $f_A/2=2048$ kHz.

Figure 4D:
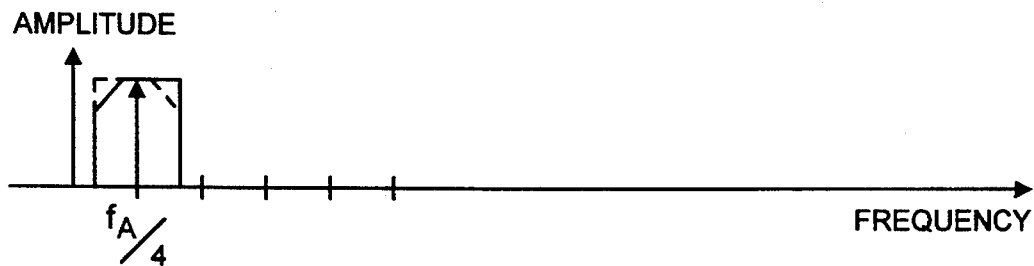
Figure 4E:
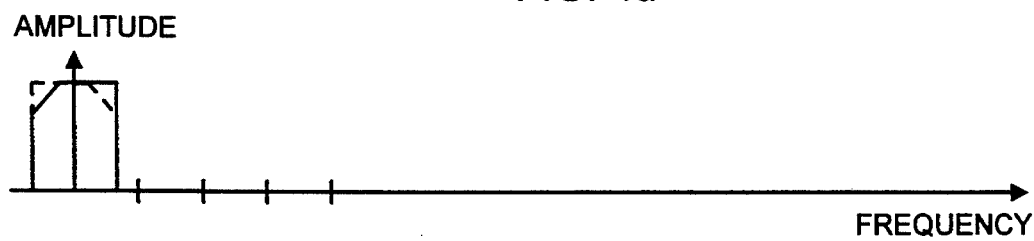

FIG. 4d illustrates the mixture in the digital mixer DM. The lower sideband from FIG. 4c is demodulated with a frequency $f_A/4$ and transferred into the baseband, as illustrated in FIG. 4e. The baseband signal of the real and imaginary signal component is emitted by the digital demodulator DM and is now available or the further digital processing.

Thus the several aforementioned objects and advantages are most effectively attained. Although a single preferred embodiment of the invention has been disclosed and described in detail herein, it should be understood that this invention is in no sense limited thereby and its scope is to be determined by that of the appended claims.

What is claimed is:

1. A receiver for a digital radio signal including:

a mixer (M) which mixes down a signal received by said receiver to a first intermediate frequency (IF1), a bandpass filter (BP) which band limits the output signal of mixer (M), an A/D converter (A/D) which samples and digitizes the output signal from said bandpass filter and outputs a digital signal;

a sampling means (AT) which samples the digital signal, and all pass filters (AP) which generate a real and an imaginary signal component, wherein only one all pass filter (AP) is employed for generating the real and imaginary signal components, wherein said only one all pass filter (AP) includes a filter coefficient (APK) which is changeable whereby a first value (a) is generated for the filter coefficient (APK) is used to calculate the real signal component and thereafter a second value (b) is used for the imaginary signal component as the output signal of the all pass filter (AP), whereby by the switching over of the values (a,b) for the filter coefficient (APK) a simultaneous sampling of the digital signal is performed at a lower rate than sampling by said A/D converter, wherein the real and the imaginary signal components are mixed down to the baseband by a single digital mixing circuit (DM), wherein switching over of the values (a,b) of the filter coefficient (APK) of the all pass filter (AP) is performed with sampling rate ($f_A$) equal to that of the A/D converter (A/D), whereby switching over generates alternately a real and an imaginary signal component and in response to the switching over the digital signal is sampled at a rate of one half of said sampling rate ($f_A$) of the A/D converter (A/D), wherein the values (a,b) of the filter coefficient (APK) of the all-pass filter (AP) are formed by a finite sum of integer powers of two, whereby a single multiplication is made possible.

2. A receiver for a digital radio signal including:

a mixer (M) which mixes down a signal received by said receiver to a first intermediate frequency (IF1), a bandpass filter (BP) which band limits the output signal of mixer (M), an A/D converter (A/D) which samples and digitizes the output signal from said bandpass filter and outputs a digital signal;

a sampling means (AT) which samples the digital signal, and all pass filters (AP) which generate a real and an imaginary signal component, wherein only one all pass filter (AP) is employed for generating the real and imaginary signal components, wherein said only one all pass filter (AP) includes a filter coefficient (APK) which is changeable whereby a first value (a) is generated for the filter coefficient (APK) is used to calculate the real signal component and thereafter a second value (b) is used for the imaginary signal component as the output signal of the all pass filter (AP), whereby by the switching over of the values (a,b) for the filter coefficient (APK) a simultaneous sampling of the digital signal is performed at a lower rate than sampling by said A/D converter, wherein the real and the imaginary signal components are mixed down to the baseband by a single digital mixing circuit (DM), wherein switching over of the values (a,b) of the filter coefficient (APK) of the all pass filter (AP) is performed with a sampling rate ($f_A$) equal to that of the A/D converter (A/D), whereby switching over generates alternately a real and an imaginary signal component and in response to the switching over the digital signal is sampled at a rate of one half of said sampling rate ($f_A$) of the A/D converter (A/D), wherein the values (a,b) of the filter coefficient (APK) of the all-pass filter (AP) are formed by a finite sum of integer powers of two, whereby a single multiplication is made possible, wherein mixing in the digital mixer circuit (DM) is performed by complementing each second real and each second imaginary signal component.

* * * * *